(12) United States Patent
Lay et al.

(10) Patent No.: US 6,759,300 B2
(45) Date of Patent: Jul. 6, 2004

(54) METHOD FOR FABRICATING FLOATING GATE

(75) Inventors: Chao-Wen Lay, Miaoli Hsien (TW); Yu-Chi Sun, Taoyuan (TW); Tse-Yao Huang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/424,526

(22) Filed: Apr. 28, 2003

(65) Prior Publication Data
US 2004/0110342 A1 Jun. 10, 2004

(30) Foreign Application Priority Data
Dec. 10, 2002 (TW) ........................................ 91135712 A

(51) Int. Cl.[7] ......................................... H01L 21/8247
(52) U.S. Cl. ...................................... 438/260; 438/266
(58) Field of Search ................................ 438/260, 264, 438/266, 267, 666

(56) References Cited
U.S. PATENT DOCUMENTS 6,090,668 A * 7/2000 Lin et al. ..................... 438/266
6,294,429 B1 * 9/2001 Lam et al. ................... 438/260
6,358,797 B1 * 3/2002 Tseng .......................... 438/266
6,586,302 B1 * 7/2003 Hopper et al. ............... 438/260
2002/0187608 A1 * 12/2002 Tseng .......................... 438/257

OTHER PUBLICATIONS

Wolf, "Silicon Processing for the VLSI Era", vol. 1, 1986, pp. 182–184, 191–194, 539–544.*

* cited by examiner

Primary Examiner—Chandra Chaudhari
(74) Attorney, Agent, or Firm—Quintero Law Office

(57) ABSTRACT

A method for fabricating a floating gate. A semiconductor substrate is provided, on which a gate dielectric layer, a conductive layer, a first insulating layer, and a patterned mask layer with an opening are formed, such that the opening exposes the first insulating layer. The insulating layer and the conducting layer are sequentially etched to form a round-cornered trench, and the photo hard mask layer is removed. A second insulating layer is formed in the round-cornered trench. The first insulating layer and the exposed conducting layer are removed using the second insulating layer as a mask, and the first conducting layer covered by the second insulating layer remains as a floating gate.

18 Claims, 7 Drawing Sheets

METHOD FOR FABRICATING FLOATING GATE

BACKGROUND OF THE INVENTION

1. Field of the Invention

The invention relates to a semiconductor process, and more particularly to a fabrication process to form a multi-tip floating gate.

2. Description of the Related Art

Memory devices for non-volatile storage of information are currently in widespread use, in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

An advantage of EPROM is that it is electrically programmed, but for erasing, requires exposure to ultraviolet (UV) light.

In many circuit designs it is desirable to have a non-volatile memory device that can be erased and reprogrammed in-circuit, without the need to remove the device.

EEPROM devices have the advantage of electrical programming and erasing, achieved by charging and discharging actions controlled by the control gate. The actions also affect the conductivity of the channel between source and drain.

One of the advantages of flash memory is its capacity for block-by-block memory erasure. Furthermore, memory erasure is fast, normally taking just 1 to 2 seconds for the complete removal of a whole block of memory. Another advantage of flash memory is its low power consumption. The voltages of a control gate, a source, and a drain are adjusted to program or erase in a split gate flash memory.

FIGS. 1a to 1c are cross-sections of the conventional method for fabricating a floating gate of a split gate flash memory.

In FIG. 1a, a silicon substrate 101 is provided. A gate oxide layer 102, a doped polysilicon layer 103, and a nitride layer 104 having an opening 105 are sequentially formed on the silicon substrate 101.

In FIG. 1b, the doped polysilicon layer 105 exposed by the opening 105 is oxidized to form an oxide layer 106, and an edge of the oxide layer 106 is a Bird's Beak shape edge.

In FIG. 1c, the nitride layer 104 is removed. The doped polysilicon layer 103 is anisotropically etched to form a floating gate 103a using the oxide layer 106 as an etching mask.

A split gate flash memory is completed after a control gate is formed on the floating gate and the silicon substrate 101 is implanted to form source/drain devices.

In the program step, high voltage is applied between the source and control gate. The high voltage applied to the source goes to the floating gate by the electric capacity coupling, and a high electric field is produced on the film gate oxide layer. The voltage is injected into the floating gate through the film gate oxide layer from the drain.

In the erase step, high voltage is applied between the drain and the control gate. A high electric field is produced on the film gate oxide layer by the electric capacity coupling. The voltage is injected into the drain through the film gate oxide layer from the floating gate, such that the gate oxide layer is damaged by the high voltage.

When the edge of the floating gate is a tip, the electrical field is easily concentrated, and the point is easily discharged. If the point discharge is increased, the erasing effect is strong.

In addition, the die size is larger due to the addition of programming circuitry and there are more processing and testing steps involved in the manufacture of these types of memory devices.

SUMMARY OF THE INVENTION

The present invention is directed to a method for fabricating a multi-tip floating gate to increase the erasing effect.

Accordingly, the present invention provides a method for fabricating a floating gate. A semiconductor substrate is provided, on which a gate dielectric layer, a conducting layer, a first insulating layer, and a patterned hard mask layer with an opening are sequentially formed, such that the opening exposes the first insulating layer. The first insulating layer and the conducting layer are sequentially etched to form a round-cornered trench using the patterned hard mask layer as a mask. The patterned hard mask layer is removed. A second insulating layer is formed in the round-cornered trench. The first insulating layer and the exposed conducting layer are sequentially removed using the second insulating layer as a mask, and the conducting layer covered by the second insulating layer remains as a floating gate.

Accordingly, the present invention also provides a method for fabricating a floating gate. A semiconductor substrate is provided, on which a gate dielectric layer, a conducting layer, a first insulating layer, and a patterned hard mask layer with an opening are sequentially formed, such that the opening exposes the first insulating layer. The first insulating layer and the conducting layer are sequentially anisotropically etched to form a bottom corner trench using the patterned hard mask layer as a mask, wherein the round-cornered trench does not expose the semiconductor substrate. The patterned hard mask layer is removed. A second insulating layer is formed on the first insulating layer, and the round-cornered trench is filled with the second insulating layer, wherein the material of the second insulating layer is different from that of the first insulating layer. The second insulating layer is planarized until the first insulating layer is exposed, and the second insulating layer remains in the round-cornered trench. The first insulating layer and the exposed conducting layer are sequentially anisotropically etched until the gate dielectric layer is exposed, and the conducting layer covered by the second insulating layer remains as a floating gate.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

FIGS. 2a to 2f are cross sections of a method for forming a multi-tip floating gate of Embodiment 1 according to the present invention.

FIGS. 3a to 3f are cross sections of a method for forming is a multi-tip floating gate of Embodiment 2 according to the present invention.

Embodiment 1

Figure 1A:
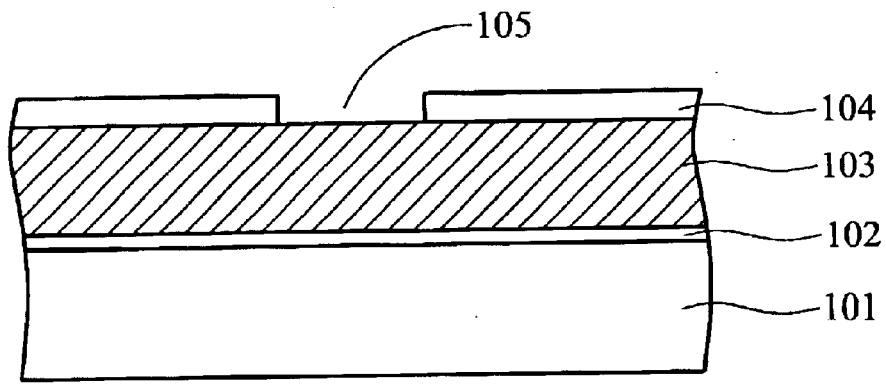
FIGS. 1a to 1c are cross-sections of the conventional method for fabricating a floating gate of a split gate flash memory.
Figure 1B:
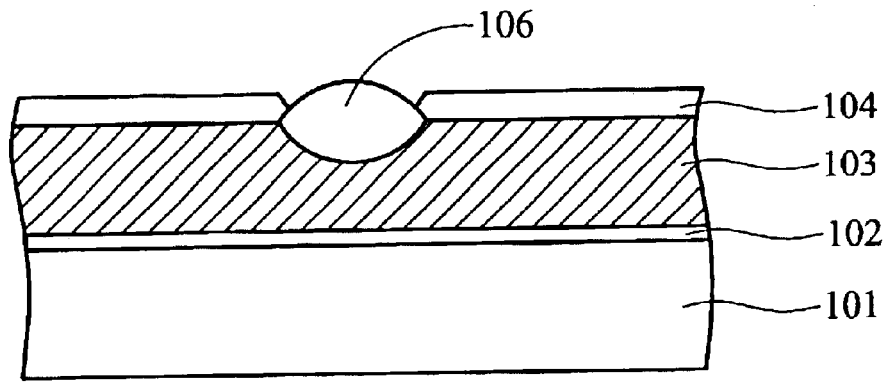
Figure 1C:
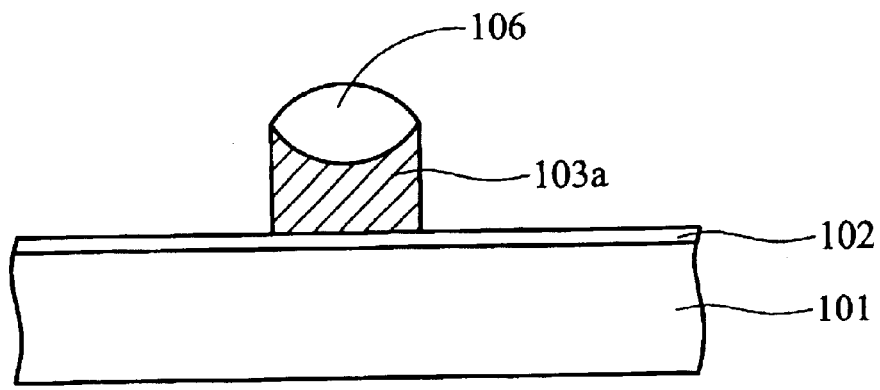
Figure 2A:
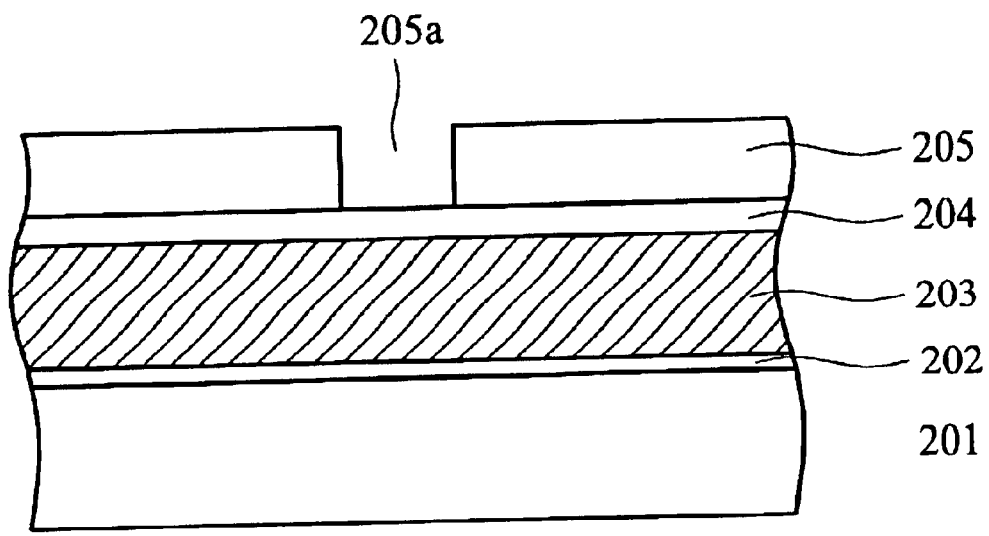
FIGS. 2a to 2f are cross sections of a method for forming a multi-tip floating gate of Embodiment 1 according to the present invention.

In FIG. 2a, a semiconductor substrate 201 is provided. A gate dielectric layer 202, such as gate oxide layer, a conducting layer 203, such as polysilicon layer or epi-silicon layer, a first insulating layer 204, such as nitride layer, and a patterned hard mask layer 205 with an opening 206 are sequentially formed on the semiconductor substrate 201, wherein the position of the opening 206 is the position of a floating gate in subsequent process, wherein the thickness of the conducting layer 203 is 1000 to 2500 Å.

Figure 2B:
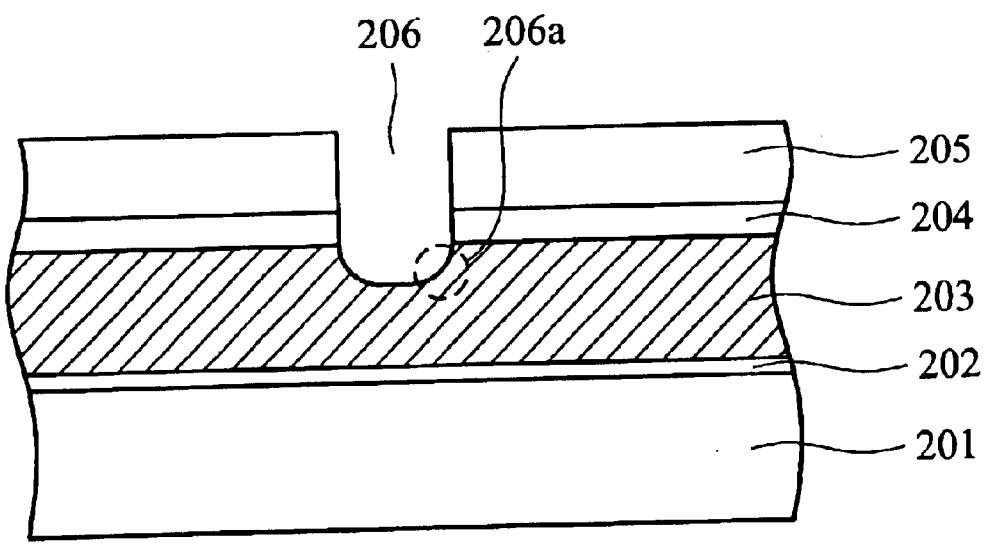

In FIG. 2b, the first insulating layer 204 and the exposed conducting 203 are anisotropically etched to form a round-cornered trench 206 in the conducting layer 203 using the patterned hard mask layer 205 as a mask, wherein the depth of the trench 206 is 800 to 2200 Å. The anisotropic etching comprises reactive ion etching or plasma etching, the reactive gas comprises CF4, CHF3, or a combination thereof, the flow can be 50 to 90 scrm, the RF power can be 150 to 250W, the temperature can be −10 to 10° C., and the pressure can be 150 to 250 mTorr.

The depth of the round-cornered trench 206 is controlled by etching time, becoming deeper as etching time increases.

The bottom corner 206a formed by less lateral etching is more rounded than with more lateral etching, and the angle of the bottom corner 206a is controlled by the value of the lateral etching.

In this case, the bottom corner 206a is formed by less lateral etching, so the bottom corner 206a is more rounded, and the tip of the floating gate formed in subsequent process is less sharp.

Figure 2C:
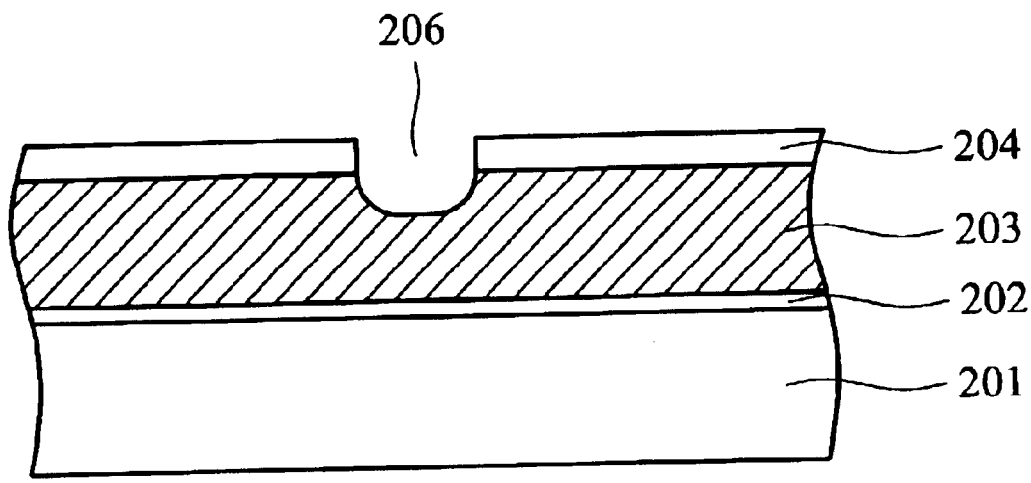
Figure 2D:
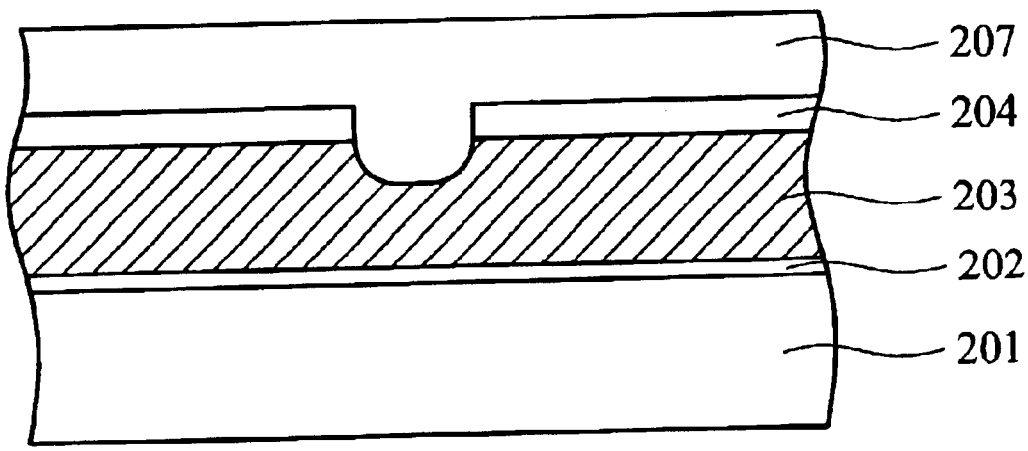

In FIG. 2c, the patterned hard mask layer 205 is removed.

In FIG. 2b, a second insulating layer 207, such as oxide layer or Fluorinated silicate glass (FSG) layer, is formed on the first insulating layer 204, and the round-cornered trench 206 is filled with the second insulating layer 207, wherein the material of the second insulating layer 207 is different from the first insulating layer 204.

Figure 2E:
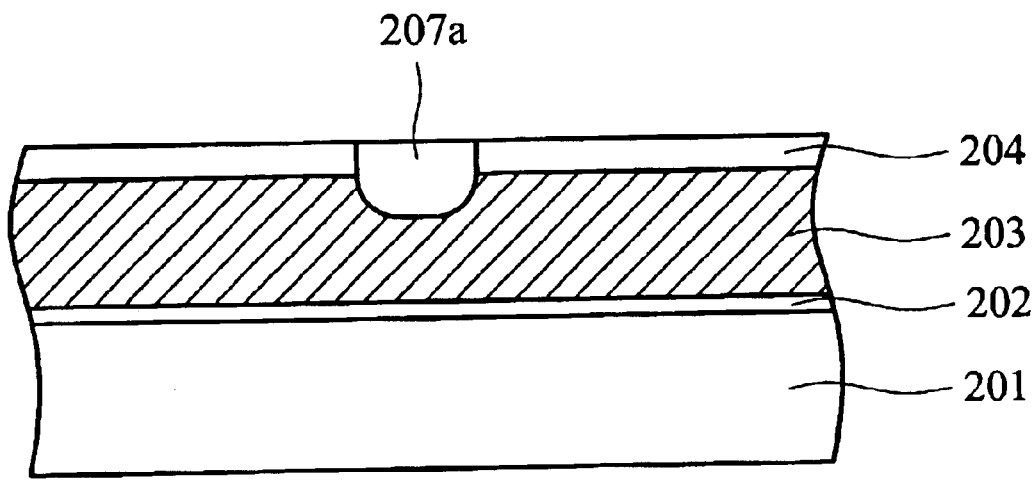

In FIG. 2e, the second insulating layer 207 is planarized until the first insulating layer 204 is exposed to leave the second insulating layer 207a in the round-cornered trench 206.

Figure 2F:
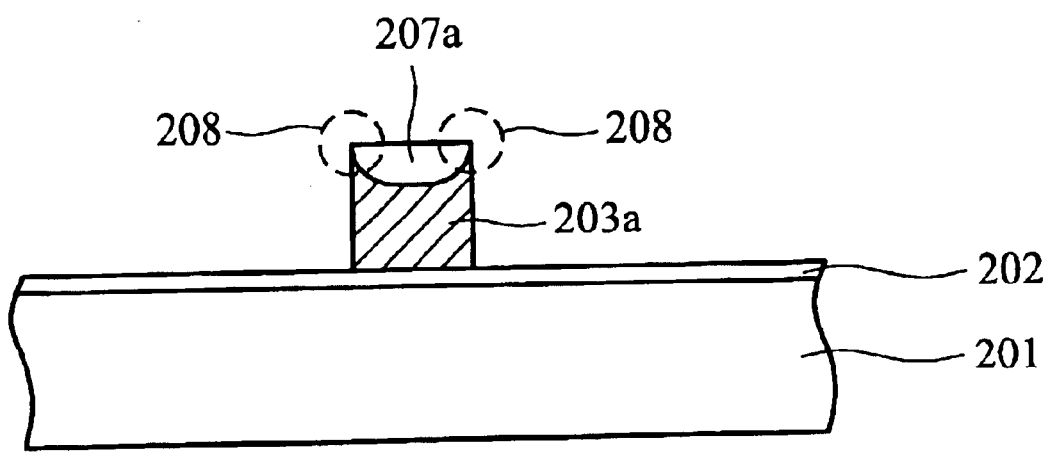

In FIG. 2f, the first insulating layer 204 and the exposed conducting layer 203 are sequentially anisotropically etched using the second insulating layer 207a as a mask, the second insulating layer 207a and the conducting layer 203a covered by the second insulating layer 207 remain, and the conducting layer 203a is a floating gate 203a, wherein the anisotropic etching comprises reactive ion etching or plasma etching.

The floating gate 203a has a tip 208, and the tip 208 is less sharp because the bottom corner 206a of the trench 206 is rounded.

Embodiment 2

Figure 3A:
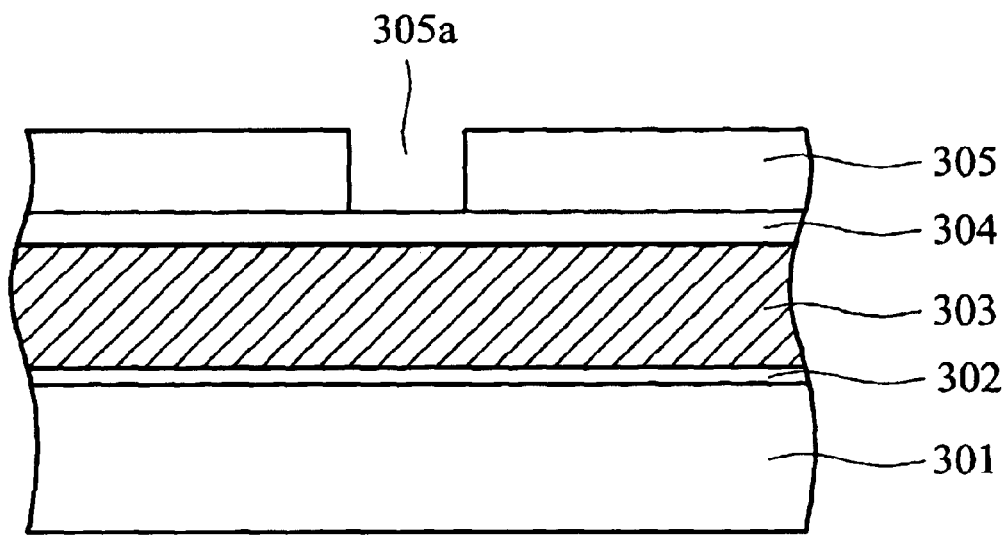
FIGS. 3a to 3f are cross sections of a method for forming a multi-tip floating gate of Embodiment 2 according to the present invention.

In FIG. 3a, a semiconductor substrate 301 is provided. A gate dielectric layer 302, such as gate oxide layer, a conducting layer 303, such as polysillcon layer or epi-silicon layer, a first insulating layer 304, such as nitride layer, and a patterned hard mask layer 305 with an opening 306 are sequentially formed on the semiconductor substrate 301, wherein the position of the opening 306 is the position of a floating gate in subsequent process, wherein the thickness of the conducting layer 303 is 1000 to 2500 Å.

Figure 3B:
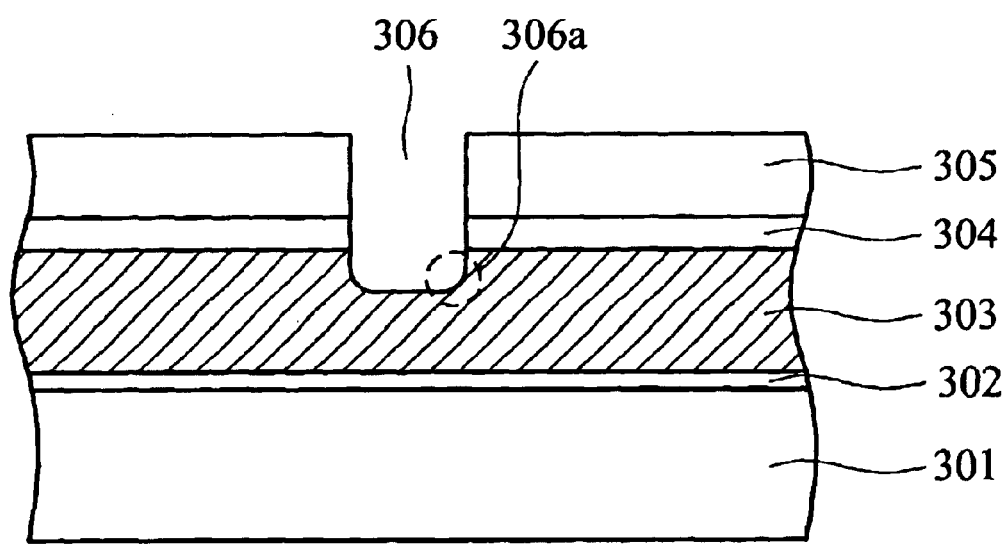

In FIG. 3b, the first insulating layer 304 and the exposed conducting 303 are anisotropically etched to form a round-cornered trench 306 in the conducting layer 303 using the patterned hard mask layer 305 as a mask, wherein the depth of the trench 306 is 800 to 2200 Å. The anisotropic etching comprises reactive ion etching or plasma etching, the reactive gas comprises CF4, CHF3, or a combination thereof, the flow can be 50 to 90 scrm, the RF power can be 150 to 250W, the temperature can be −10 to 10° C., and the pressure can be 150 to 250 mTorr.

The depth of the round-cornered trench 306 is controlled by etching time, becoming deeper as etching time increases.

The bottom corner 306a formed by less lateral etching is more rounded than with more lateral etching, and the angle of the bottom corner 306a is controlled by the value of the lateral etching.

In this case, the bottom corner 306a is formed by more lateral etching, so the bottom corner 306a is not rounded, and the tip of the floating gate formed in subsequent process is sharper.

Figure 3C:
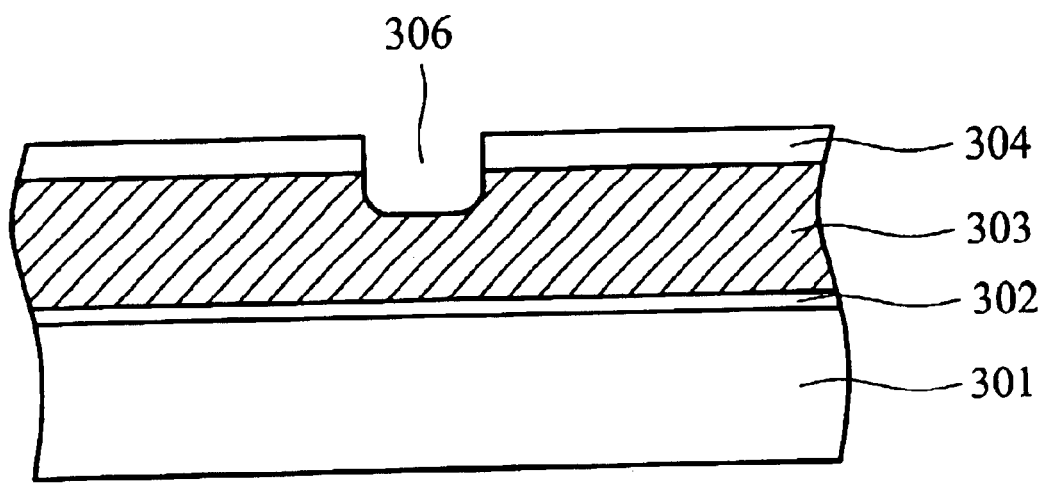
Figure 3D:
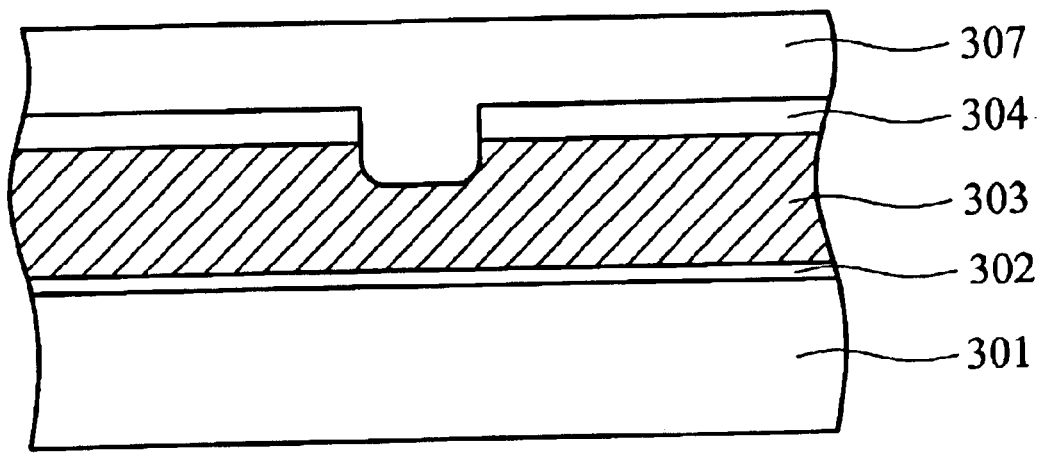

In FIG. 3c, the patterned hard mask layer 305 is removed.

In FIG. 3b, a second insulating layer 307, such as oxide layer or Fluorinated silicate glass (FSG) layer, is formed on the first insulating layer 304, and the round-cornered trench 306 is filled with the second insulating layer 307, wherein the material of the second insulating layer 307 is different from the first insulating layer 304.

Figure 3E:
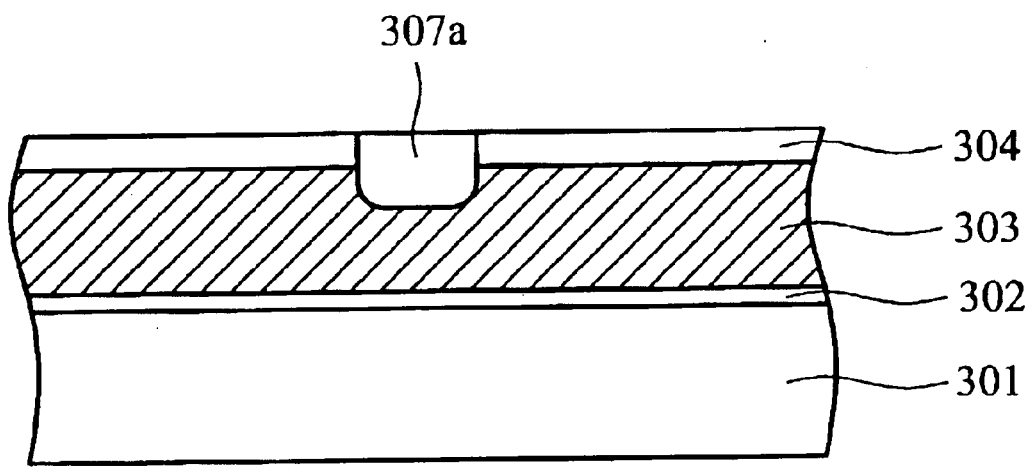

In FIG. 3e, the-second insulating layer 307 is planarized until the first insulating layer 304 is exposed to leave the second insulating layer 307a in the round-cornered trench 306.

Figure 3F:
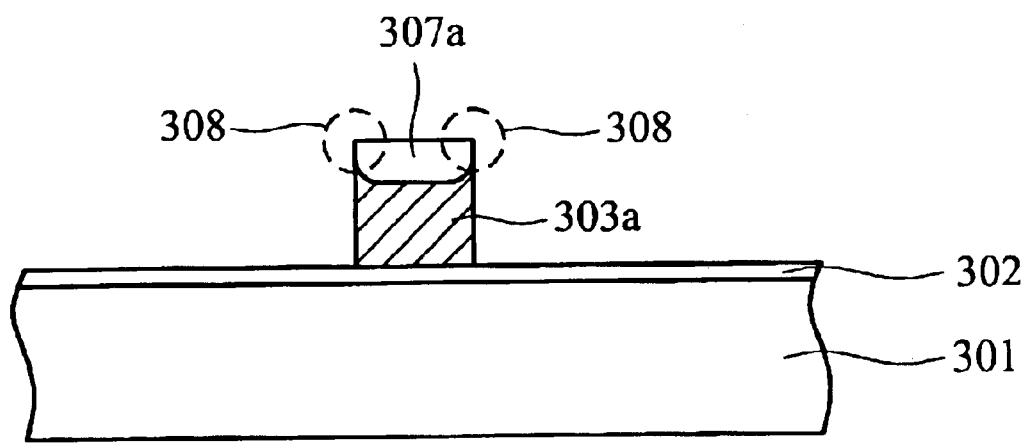

In FIG. 3f, the first insulating layer 304 and the exposed conducting layer 303 are sequentially anisotropically etched using the second insulating layer 307a as a mask, the second insulating layer 307a and the conducting layer 303a covered by the second insulating layer 307 remain, and the conducting layer 303a is a floating gate 303a, wherein the anisotropic etching comprises reactive ion etching or plasma etching.

The floating gate 303a has a tip 308, and the tip 308 is sharper when the bottom corner 306a of the trench 306 is not rounded. The bottom corner 206a of the trench 206 in FIG. 2b is more rounded than the bottom corner 306a of the trench 306 in FIG. 3b, so the tip 308 of the floating gate 303a in FIG. 3f is sharper than the tip 208 of the floating gate 203a in FIG. 2f.

Concentration of the electric field easily occurs in the tip, and the point is easily discharged. Point discharge is increased by the multiple tips of the floating gate in the present invention. Thus, data erasing for the flash memory having the multi-tip floating gate is increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a floating gate, comprising:
    providing a semiconductor substrate on which a gate dielectric layer, a conducting layer, a first insulating layer, and a patterned hard mask layer with an opening are sequentially formed, such that the opening exposes the first insulating layer;

sequentially etching the first insulating layer and the conducting layer to form a round-cornered trench using the patterned hard mask layer as a mask;

forming a second insulating layer in the round-cornered trench and on the top surface of the first insulating layer; and sequentially removing the first insulating layer and the exposed conducting layer using the second insulating layer as a mask, wherein the remaining conducting layer is a floating gate.

2. The method for fabricating a floating gate as claimed in claim 1, wherein the gate dielectric layer is a gate oxide layer.

3. The method for fabricating a floating gate as claimed in claim 1, wherein the conducting layer is a polysilicon layer or an epi-silicon layer.

4. The method for fabricating a floating gate as claimed in claim 1, wherein the first insulating layer is a nitride layer.

5. The method for fabricating a floating gate as claimed in claim 1, wherein the method of etching comprises anisotropic etching.

6. The method for fabricating a floating gate as claimed in claim 5, wherein the anisotropic etching comprises reactive ion etching or plasma etching.

7. The method for fabricating a floating gate as claimed in claim 1, wherein reactive gas used in the anisotropic etching comprises CF4, CHF3, or a combination thereof.

8. The method for fabricating a floating gate as claimed in claim 1, wherein the material of the second insulating layer is different from that of the first insulating layer.

9. The method for fabricating a floating gate as claimed in claim 1, wherein the second insulating layer is an oxide layer or a Fluorinated silicate glass layer.

10. A method for fabricating a floating gate, comprising:

providing a semiconductor substrate on which a gate dielectric layer, a conducting layer, a first insulating layer, and a patterned hard mask layer with an opening are sequentially formed thereon, such that the opening exposes the first insulating layer;

anisotropically etching the first insulating layer and the conducting layer to form a round-cornered trench using the patterned hard mask layer as a mask, wherein the round-cornered trench does not expose the gate dielectric layer;

removing the patterned hard mask layer;

forming a second insulating layer on the first insulating layer, wherein the round-cornered trench is filled with the second insulating layer, and the material of the second insulating layer is different from that of the first insulating layer;

planarizing the second insulating layer to expose the first insulating layer, such that the second insulating layer in the round-cornered trench remains; and sequentially etching the first insulating layer and the conducting layer covered by the first insulating layer to expose the gate dielectric layer using the second insulating layer as a mask, wherein the conducting layer covered by the second insulating layer remains as a floating gate.

11. The method for fabricating a floating gate as claimed in claim 10, wherein the gate dielectric layer is a gate oxide layer.

12. The method for fabricating a floating gate as claimed in claim 10, wherein the conducting layer is a polysilicon layer or an epi-silicon layer.

13. The method for fabricating a floating gate as claimed in claim 10, wherein the thickness of the conducting layer is 1000 to 2500 Å.

14. The method for fabricating a floating gate as claimed in claim 10, wherein the anisotropic etching comprises reactive ion etching or plasma etching.

15. The method for fabricating a floating gate as claimed in claim 14, wherein reactive gas used in the anisotropic etching comprises CF4, CHF3, or a combination thereof.

16. The method for fabricating a floating gate as claimed in claim 10, wherein the depth of the round-cornered trench is 800 to 2200 Å.

17. The method for fabricating a floating gate as claimed in claim 10, wherein the second insulating layer is an oxide layer or a Fluorinated silicate glass layer.

18. The method for fabricating a floating gate as claimed in claim 10, wherein the method of planarizing is chemical mechanical polishing.

* * * * *